(12) United States Patent
Jain et al.

(10) Patent No.: US 11,043,480 B1
(45) Date of Patent: Jun. 22, 2021

(54) FORMING AND/OR CONFIGURING STACKED DIES

(71) Applicant: XILINX, INC., San Jose, CA (US)

(72) Inventors: Praful Jain, San Jose, CA (US); Martin Voogel, Niwot, CO (US); Brian Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/437,498

(22) Filed: Jun. 11, 2019

(51) Int. Cl.
  *H01L 25/00* (2006.01)
  *H01L 21/66* (2006.01)
  *H01L 25/065* (2006.01)

(52) U.S. Cl.
  CPC .......... *H01L 25/50* (2013.01); *H01L 22/14* (2013.01); *H01L 25/0657* (2013.01); *H01L 2225/06513* (2013.01); *H01L 2225/06589* (2013.01); *H01L 2225/06593* (2013.01); *H01L 2225/06596* (2013.01)

(58) Field of Classification Search
  None
  See application file for complete search history.

(56) References Cited

U.S. PATENT DOCUMENTS

| | | | |
|---|---|---|---|
| 7,823,102 B2 | 10/2010 | Chandra et al. | |
| 8,299,590 B2 | 10/2012 | Rahman | |
| 9,323,870 B2 | 4/2016 | Chandra | |
| 9,947,386 B2 | 4/2018 | Arora et al. | |
| 10,147,666 B1 | 12/2018 | Trimberger et al. | |
| 10,224,310 B2 | 3/2019 | Liu | |
| 2004/0016939 A1* | 1/2004 | Akiba | H01L 23/3128 257/126 |
| 2014/0192583 A1* | 7/2014 | Rajan | G11C 5/06 365/63 |
| 2017/0186728 A1* | 6/2017 | Chainer | H01L 23/473 |
| 2018/0158749 A1* | 6/2018 | Yu | H01L 21/6835 |
| 2019/0333892 A1* | 10/2019 | Gaide | H01L 25/50 |

OTHER PUBLICATIONS

Brunschwiler, Thomas, et al., "Benchmarking Study on the Thermal Management Dimensional Integrated Circuits: From Back-Side to Volumetric Heat Removal", Transactions of the ASME, vol. 138, Mar. 2016 (http://electronicpackaging.asmedigitalcollection.asme.org/article.aspx?articleid=2503794).
Unpublished U.S. Appl. No. 15/967,109, filed Apr. 30, 2018, Entitled: Redundancy Scheme for 3D Stacked Device.

\* cited by examiner

*Primary Examiner* — Zandra V Smith
*Assistant Examiner* — Lawrence C Tynes, Jr.
(74) *Attorney, Agent, or Firm* — Patterson + Sheridan, LLP

(57) ABSTRACT

Examples described herein generally relate to forming and/or configuring a die stack in a multi-chip device. An example is a method of forming a multi-chip device. Dies are formed. At least two or more of the dies are interchangeable. Characteristics of the at least two or more of the dies that are interchangeable are determined. A die stack comprising the at least two or more of the dies that are interchangeable is formed. Respective placements within the die stack of the at least two or more of the dies that are interchangeable are based on the characteristics.

18 Claims, 3 Drawing Sheets

FORMING AND/OR CONFIGURING STACKED DIES

TECHNICAL FIELD

Examples of the present disclosure generally relate to stacked dies in a multi-chip device, and in particular, relate to forming and/or configuring stacked dies in a multi-chip device.

BACKGROUND

As technology progresses and process nodes for integrated circuits have decreased, three-dimensional technology has also expanded. Three-dimensional technology can include stacking dies to form a single device. Stacking dies in such a way can decrease a footprint of the device and can decrease power consumption. There are many technologies that can be implemented to stack dies. However, as three-dimensional technology grows, new challenges are being created, and new opportunities for additional development are being presented.

SUMMARY

Examples described herein generally relate to forming and/or configuring a die stack in a multi-chip device. In some examples, dies that have interchangeable placements in a die stack are stacked according to characteristics of those dies, such as respective projected amounts of leakage current, power densities, and/or junction temperatures. In some examples, dies in a die stack include a redundant die, and those dies can include segments that align in respective slivers. Segments in slivers can be identified for activation based on considerations of junction temperatures, static power, and/or performance. The ordering of stacking dies and/or activation of segments can achieve various benefits, including reduced junction temperatures, balancing performance between dies, maximizing performance, and/or reducing static power consumption.

An example of the present disclosure is a method of forming a multi-chip device. Dies are formed. At least two or more of the dies are interchangeable. Characteristics of the at least two or more of the dies that are interchangeable are determined. A die stack comprising the at least two or more of the dies that are interchangeable is formed. Respective placements within the die stack of the at least two or more of the dies that are interchangeable are based on the characteristics.

Another example of the present disclosure is a method of implementing a multi-chip device. Whether segments of interchangeable dies in a die stack are functional is determined. N number of the interchangeable dies are in the die stack. Segments that align in the interchangeable dies form respective slivers. The interchangeable dies are configured into M number of logical dies when each sliver includes at least the M number of segments that are functional. The M number is less than the N number. Configuring the interchangeable dies into the M number of the logical dies further includes activating segments of each sliver that includes more than the M number of segments that are functional based on a projected temperature of the die stack, a projected static power of the die stack, a projected performance of the die stack, or a combination thereof.

Another example of the present disclosure is a method of forming a multi-chip device. Respective projected amounts of leakage current of interchangeable dies to be stacked in a die stack are determined. The die stack is formed. Placements in the die stack of the interchangeable dies are in an order of the interchangeable dies having increasing projected amounts of leakage current toward a heat sink to be attached to the die stack.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
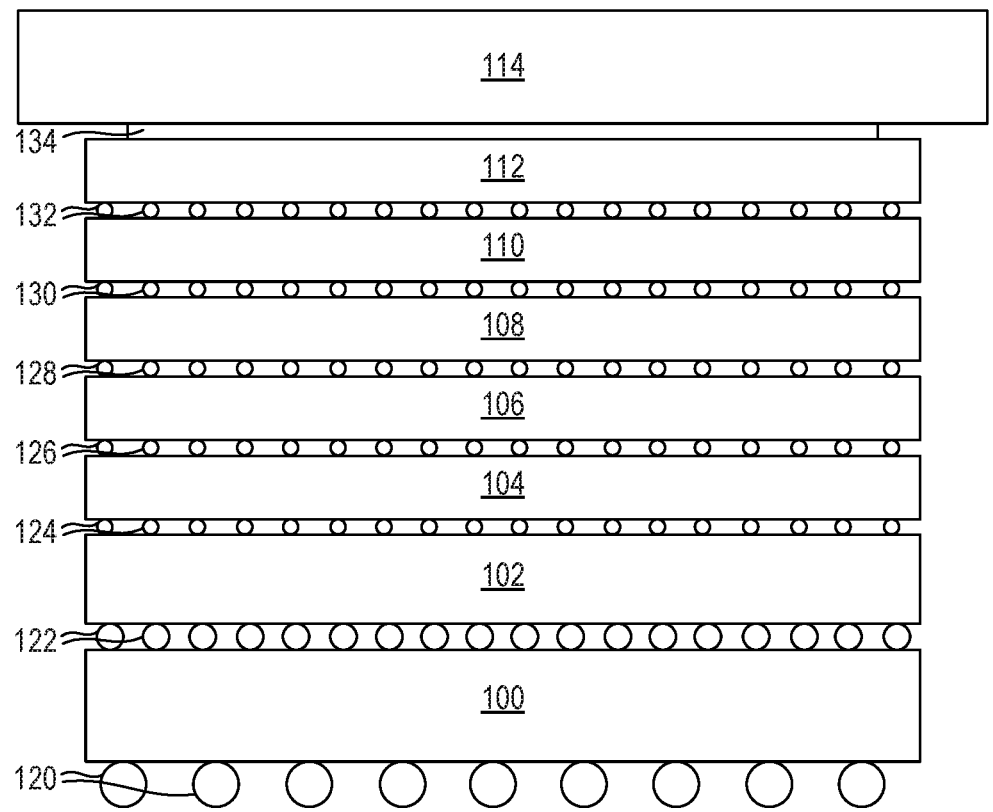
FIG. 1 is a structure of a multi-chip device according to some examples.

Examples described herein generally relate to forming and/or configuring a die stack in a multi-chip device. In some examples, dies that have interchangeable placements in a die stack are stacked according to characteristics of those dies, such as respective projected amounts of leakage current, projected amounts of power densities, and/or projected junction temperatures. In some examples, dies in a die stack include a redundant die, and those dies can include segments that align in respective slivers. Segments in slivers can be identified for activation based on considerations of junction temperatures, static power, and/or performance when functional segments in the respective sliver permit such activation. The ordering of stacking dies and/or activation of segments can achieve various benefits, including reduced junction temperatures, balancing performance between dies, maximizing performance, and/or reducing static power consumption.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a structure of a multi-chip device according to some examples. The multi-chip device shown in FIG. 1 is to facilitate description and understanding of aspects of various examples described herein. Various other multi-chip devices can have different structures, different number of dies, additional components, etc.

The multi-chip device includes a package substrate 100, a first die 102, a second die 104, a third die 106, a fourth die 108, a fifth die 110, a sixth die 112, and a heat sink 114. Generally, the dies 102-112 are stacked and form a die stack in the multi-chip device.

External connectors 120 are attached to the package substrate 100 and may further be attached to, e.g., a printed circuit board (PCB) to attach the package substrate 100 (and hence, the multi-chip device) to the PCB. The external connectors 120 may be, for example, ball grid array (BGA) balls or other connectors. External connectors 122 are attached to the first die 102 (e.g., on a front side) and to the package substrate 100 on a side opposite from the external connectors 120. The external connectors 122 can be, for example, controlled collapse chip connections (C4) bumps or other connectors. External connectors 124 are attached to the second die 104 (e.g., on a front side) and to the first die 102 (e.g., on a backside). External connectors 126 are attached to the third die 106 (e.g., on a front side) and to the second die 104 (e.g., on a backside). External connectors 128 are attached to the fourth die 108 (e.g., on a front side) and to the third die 106 (e.g., on a backside). External connectors 130 are attached to the fifth die 110 (e.g., on a front side) and to the fourth die 108 (e.g., on a backside). External connectors 132 are attached to the sixth die 112 (e.g., on a front side) and to the fifth die 110 (e.g., on a backside). The external connectors 124, 126, 128, 130, 132 can be, for example, microbumps, minibumps, or other connectors. An adhesive 134 is adhered to the heat sink 114 and the sixth die 112 (e.g., on a backside). The adhesive 134 can be any thermally conductive adhesive.

In other examples, the dies 102-112 can be bonded together without the use of external connectors (such as by wafer-to-wafer bonding or die-to wafer bonding). In some examples, some of the dies 102-112 can be attached together by external connectors while others of the dies can be bonded together without use of external connectors. Any permutation of bonding and use of external connectors can be implemented.

One die stack including the dies 102-112 is illustrated in FIG. 1. In other examples, multiple die stacks can be implemented in a multi-chip device. For example, an interposer can be implemented between the package substrate 100 and the first die 102, such that the die stack of dies 102-112 are attached to the interposer, and another die stack can be attached to the interposer. In some examples, another die stack can be attached to the package substrate 100.

Any heat sink 114 or other heat dissipation element can be implemented. The heat sink 114 can also take the form of a lid. The heat sink 114 can have any physical configuration. In the illustrated example, the adhesive 134 attaches the heat sink 114 to the die stack of dies 102-112. In other forms, the heat sink 114 can be mechanically attached to other structures, such as a PCB, the package substrate 100, and/or an encapsulant (such as a molding compound, molding underfill (MUF), or the like). In such instances, a thermal grease can be implemented in the place of the adhesive 134, for example.

As indicated, various other components can be included in a multi-chip device. For example, an interposer, an encapsulant (such as a molding compound, MUF, or the like), etc. can be included in the multi-chip device. A person having ordinary skill in the art will readily envision various modifications that can be made to the multi-chip device.

Multiple ones of the dies 102-112 have a same integrated circuit (IC) formed on the respective die 102-112. Accordingly, those multiple ones of the dies 102-112 can be interchangeably placed within the die stack. For example, if the second die 104 and the fifth die 110 have the same IC, the second die 104 can be placed in the die stack where the fifth die 110 is placed as illustrated in FIG. 1, and vice versa. Further, having the same ICs in the die stack can permit redundancy in the multi-chip device. For example, if one of those multiple ones of the dies 102-112 is faulty, a redundant other one of those multiple ones of the dies 102-112 can be used or activated in place of the faulty die, e.g., by power gating and/or switching.

As an example, the first die 102 can have an interconnect IC; each of the dies 104-110 can have a same programmable IC; and the sixth die 112 can have an accelerator IC. Each of the dies 102-110 include through-substrate vias (TSVs) through the respective semiconductor substrates of the dies 102-110 to accommodate directing signals and power vertically in the die stack. The interconnect IC on the first die 102 can route and direct signals and power horizontally and then vertically in the die stack. The interconnect IC can further include various subsystems and may be a System-on-Chip (SoC). For example, the interconnect IC can include a processing system that, among other things, can control configurations or programming of the programmable ICs of the dies 104-110 (e.g., by a controller of the processing system). Additionally, the interconnect IC can have a Network-on-Chip (NoC), input/output blocks (such as eXtreme Performance Input/Output (XPIO), multi-gigabit transceivers (MGTs), high bandwidth memory (HBM) interfaces, peripheral component interconnect express (PCIe) interfaces, cache coherent interconnect for accelerators (CCIX) interfaces, Analog-to-Digital Converters (ADC), Digital-to-Analog Converters (DAC), etc.), and/or any intellectual property (IP) hard blocks (such as memory controllers (like double data rate (DDR) memory controllers, high bandwidth memory (HBM) memory controllers, or the like), PCIe blocks, CCIX blocks, Ethernet cores, forward error correction (FEC) blocks, etc.).

The programmable ICs of the dies 104-110 can include programmable logic regions. The programmable logic regions can include programmable logic elements including configurable logic blocks (CLBs), look-up tables (LUTs), random access memory blocks (BRAM), Ultra RAMs (URAMs), input/output blocks (IOBs), digital signal processing blocks (DSPs), clock managers, and/or delay lock loops (DLLs). In some architectures, the programmable logic regions can include columns of programmable logic elements, where each column includes a single type of programmable logic element (e.g., a column of CLBs, a column of BRAMs, etc.). The programmable logic elements can have one or more associated programmable interconnect elements. For example, in some architectures, the programmable logic regions include a column of programmable interconnect elements associated with and neighboring each column of programmable logic elements. In such examples, each programmable interconnect element is connected to an associated programmable logic element in a neighboring column and is connected to neighboring programmable interconnect elements within the same column. The interconnected columns of programmable interconnect elements can form a global routing network within the programmable logic region. In some examples, the programmable ICs can include a controller (with boot read-only memory (ROM)) and a NoC. The controller can read the ROM to configure the respective programmable IC to a base configuration that permits the programmable IC to receive configuration data, e.g., from the interconnect IC of the first die 102 for a system-level configuration.

The accelerator IC of the sixth die 112 can include any accelerator. The accelerator can be an application specific IC (ASIC), a programmable IC, or any other accelerator IC.

In this example, the placement of the dies 104-110 (each with the same programmable IC) can be interchangeable without changing a design of the multi-chip device. The first die 102 and sixth die 112 have static placements based on the design of the multi-chip device. The ability to change the placements of the dies 104-110 can permit arranging the dies 104-110 in a manner that provides improved thermal characteristics, which can permit improved characteristics of the multi-chip device.

Additionally, if the dies 104-110 include redundancy, and if, for example, none of the dies 104-110 is faulty, the selection of which of the dies 104-110 to actively use in the die stack can be based on thermal characteristics. The ability to select which of the dies 104-110 to actively use can provide improve performance of the multi-chip device and/ or improved thermal characteristics.

The dies 102-112 generate thermal energy when in operation. A significant contributor to the thermal energy is the back end of the line (BEOL) metal layers in each die 102-112. Electrical resistance in these metal layers coupled with higher currents through the metal layers can cause significant (e.g., parasitic) power consumption that is converted to thermal energy.

Figure 2:
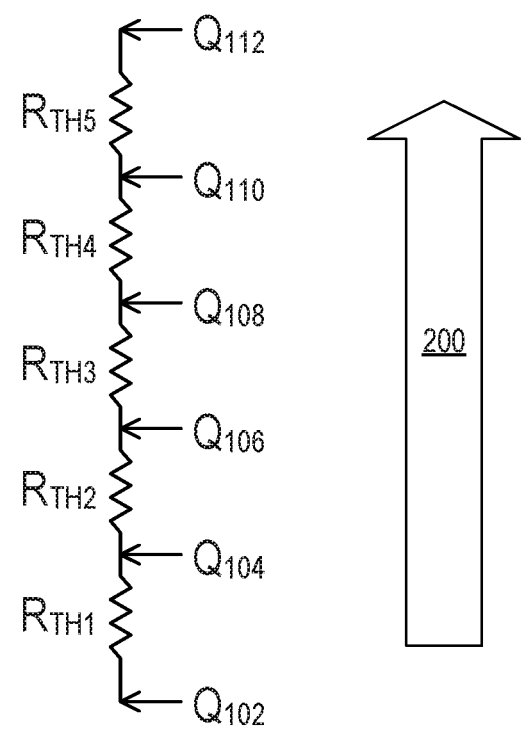
FIG. 2 is a simplified heat flow schematic according to some examples.

The thermal energy largely dissipates through the heat sink 114. FIG. 2 illustrates a simplified heat flow schematic according to some examples. FIG. 2 illustrates the direction 200 of heat flow towards the heat sink 114. Each die 102-112 adds a respective power density $Q_{102}$, $Q_{104}$, $Q_{106}$, $Q_{108}$, $Q_{110}$, $Q_{112}$ (e.g., in Watts per square centimeter (W/cm$^2$)) in the heat flow schematic. Schematically, a thermal resistance (e.g., in degrees Kelvin times square centimeter per Watt (K*cm$^2$/W)) is between each die 102-112, although practically, the thermal resistances can be due to materials of the dies 102-112. As illustrated, a thermal resistance $R_{TH1}$ is between the first die 102 and second die 104 (although the thermal resistance $R_{TH1}$ includes materials of the dies 102, 104). A thermal resistance $R_{TH2}$ is between the second die 104 and third die 106. A thermal resistance $R_{TH3}$ is between the third die 106 and fourth die 108. Similarly, thermal resistances $R_{TH4}$, $R_{TH5}$ are, respectively, between the fourth die 108 and fifth die 110 and between the fifth die 110 and sixth die 112. Junction temperatures can be simplistically determined at each thermal resistance. A junction temperature can generally be the accumulated power densities in the direction 200 of heat flow times the respective thermal resistance. For example, the junction temperature ($T_j$) at the thermal resistance $R_{TH1}$ is the power density $Q_{102}$ times the thermal resistance $R_{TH1}$ ($T_j=Q_{102}*R_{TH1}$). The junction temperature ($T_j$) at the thermal resistance $R_{TH4}$ is the sum of the power densities $Q_{102}$, $Q_{104}$, $Q_{106}$, $Q_{108}$ times the thermal resistance $R_{TH4}$ ($T_j=(Q_{102}+Q_{104}+Q_{106}+Q_{108})*R_{TH4}$).

As illustrated by the heat flow schematic, generally, junction temperature in the die stack increases in the direction 200 of heat flow due to the accumulation of the power densities (assuming that, generally, the thermal resistances are approximately equal). Accordingly, the junction temperature and thermal energy at the sixth die 112 (e.g., the top die) can be a high temperature and thermal energy, which can be higher than the temperature and thermal energy at the fifth die 110, which can be higher than the temperature and thermal energy at the fourth die 108, etc.

Increased junction temperature and thermal energy at a die (e.g., by accumulation of power densities from other dies) can cause carriers (e.g., electrons and/or holes) in the semiconductor substrate of the die to have increased energy. This increased energy of the carriers can cause increased leakage current. For example, for a die operating in a range of about 85° C. to about 100° C., an increase in a junction temperature of about 10° C. can result in about a 20% increase in leakage current. The increased leakage current can cause increased power consumption that generates increased thermal energy. Accordingly, increased thermal energy and junction temperature can be a compounding issue.

In some examples, dies are placed in a stack in a manner that attempts to minimize, at various dies, the accumulated power densities along a direction of heat flow. This can be accomplished by placing dies with the greatest power density (e.g., the dies that generate the greatest thermal energy) nearer to the heat sink 114 when the placements of such dies are interchangeable. As an example, assume that the fourth die 108 and second die 104 (as placed in the illustration of FIG. 1) have power densities of 500 arbitrary units (a.u.) and 100 a.u., respectively. In such a situation, the junction temperature at the third die 106 will be the sum of the power density of the first die 102 and 100 a.u (the power density of the second die 104) times the thermal resistance $RTH_2$. If the placement of the fourth die 108 and the second die 104 is switched from what is illustrated in FIG. 1, the junction temperature at the third die 106 will be the sum of the power density of the first die 102 and 500 a.u (the power density of the fourth die 108 in the place of the second die 104) times the thermal resistance $RTH_2$, which results in an increased junction temperature by 400 a.u. times the thermal resistance $RTH_2$. Additionally, reducing accumulated power densities at dies can be accomplished, when redundancy is implemented and a redundant IC permits selectively choosing which die is operated, by operating the die that is nearer to the heat sink 114.

Figure 3:
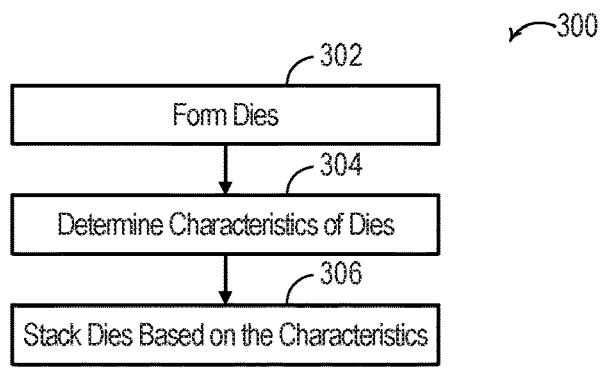
FIG. 3 is a flow chart of a method for forming a die stack for a multi-chip device according to some examples.

FIG. 3 is a flow chart of a method 300 for forming a die stack for a multi-chip device according to some examples. The method 300 of FIG. 3 can determine characteristics of the dies 102-112 that form the die stack and responsively stacks various ones of the dies 102-112 in an order that can minimize the thermal energy and junction temperature at one or more of the dies.

At block 302, each die that is to be included in the die stack is formed. The formation of the dies can be according to any semiconductor processing. For example, a die can be formed as part of a larger substrate (e.g., a wafer), and the substrate can be processed using any deposition, etch, etc. process.

At block 304, a test is performed to determine characteristics of various dies that are to be included in the die stack. For example, the testing can be an E-test and/or wafer sort testing. In some examples, each die formed on the substrate (e.g., wafer) can be probed and tested. Additionally, test structures formed, e.g., in scribe lines on the wafer can be tested. The testing can determine characteristics of the dies on the substrate. For example, a process corner of the dies can be determined by the testing. The process corner can determine a projected amount of leakage current that can occur in the die and the threshold voltage of transistors formed in the die, which can determine a projected amount of an operating current through the transistors. An projected power density for each die can be extrapolated based on the current in the die. Generally, greater current (e.g., accumulated leakage current and operating current) in a die leads to a greater power density for the die.

At block 306, the dies are stacked based on the characteristics. Dies that have placements that are interchangeable are stacked such that the order of those dies in the die stack has an increasing power density in a direction that heat will flow in the die stack when in operation. Referring back to the preceding example where each of dies 104-110 have a same programmable IC, and the dies 104-110 are stacked as illustrated in FIG. 1, the second die 104 has a lowest power density of the dies 104-110, and the fifth die 110 has a greatest power density of the dies 104-110. The fourth die 108 has a greater power density than the third die 106. In such example, the first die 102 and the sixth die 112 are not interchangeably placed with another one or more dies. Hence, the first die 102 and the sixth die 112 are placed as shown in FIG. 1.

In some examples, the dies that can be interchangeably placed are stacked in an order based on increasing projected amount of leakage current as a position or placement nears or approaches the heat sink. For example, dies that have higher projected amounts of leakage current are placed in a position closer to a heat sink relative to dies that have lower projected amounts of leakage current. The amount of leakage current can have a correlation to power density, as described. Generally, dies with lower leakage current can have lower sensitivity to temperature increases. Accordingly, placing dies with lower leakage current in a position where heat is more difficult to dissipate (e.g., due to distance from a heat sink) can have a less significant impact in static power consumed by the multi-chip device compared to placing dies with higher leakage current in such a position. Further, by placing dies with lower leakage current and power density lower in the die stack further from the heat sink, less power from bottom dies pass through respective thermal resistances at one or more of the dies to reduce the junction temperature at those one or more dies. Even further, performance differences between dies that can be interchangeably placed can be reduced by stacking such dies as described. Dies with higher leakage current tend to have lower resistance, and conversely, dies with lower leakage current tend to have higher resistance. By placing dies with lower leakage current closer to the package substrate (e.g., through which signals are transmitted), resistances of paths to/from dies with higher leakage current can be increased (e.g., due to placing those dies further from the package substrate), while resistances of paths to/from dies with lower leakage current can be decreased. This can better balance the total resistances of paths to/from and in the dies, which can better balance performances of the dies.

The mechanism by which the dies 102-112 are stacked can vary. For example, if the dies 102-112 are attached by external connectors as illustrated in FIG. 1, die-to-wafer stacking may be performed, which can include reflowing solder of the external connectors or direct bonding a die to a wafer. In other examples, the dies 102-112 can be stacked at a wafer level by wafer-to-wafer bonding. The dies can be stacked and bonded at the wafer level and subsequently singulated (e.g., by sawing) to form the die stack for the multi-chip device.

Figure 4:
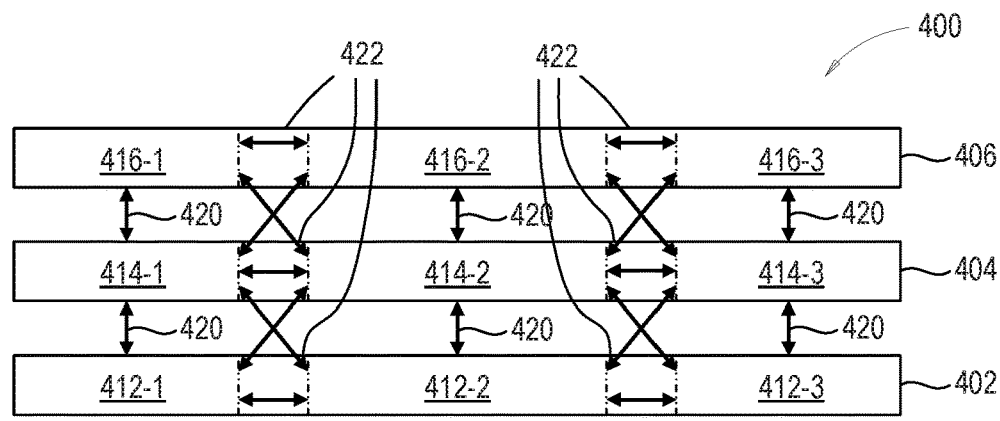
FIG. 4 depicts, schematically, redundancy in a die stack according to some examples.

FIG. 4 depicts, schematically, redundancy in a die stack 400 according to some examples. The die stack 400 is illustrated as including a first die 402, a second die 404, and a third die 406. Each of these dies 402-406 has a same IC for redundancy purposes, and hence, can be interchangeably placed in a die stack. As used herein, a die refers to a physical die (as opposed to a logical die) unless context in which the term is used indicates that the term refers to a logical die. Any number of physical dies can be implemented in a die stack for redundancy purposes. For example, four dies are implemented for redundancy in examples previously described.

In some examples, each die is capable of being wholly deactivated (e.g., by power gating) when that die is faulty and/or when that die is chosen to not be an active die in the die stack. Aspects described herein are applicable to such examples.

In the illustrated example, the IC in each die 402-406 is or includes segments. The segments can be logical segments and/or physical segments. In some examples, the segments are segments of one or more programmable logic regions (e.g., segments of a fabric of a field programmable gate array (FPGA)). Division between segments may be based on any number of logical and/or physical boundaries, such as a boundary between differing clock domains, a boundary between differing voltage domains, a boundary between differing types of circuitry or logic blocks, or the like. The first die 402 includes segments 412-1, 412-2, 412-3. The second die 404 includes segments 414-1, 414-2, 414-3. The third die 406 includes segments 416-1, 416-2, 416-3. The dies 402-406 can include any number of segments arranged in any physical and/or logical configuration.

In this example, individual segments can be deactivated (e.g., by power gating) when that segment is faulty and/or when that segment is chosen to not be an active segment in the die stack. Segments that align logically and/or physically across the dies 402-406 can form a sliver. Each segment in a sliver is the same and/or functionally equivalent to the other segments in that sliver. Segments in different slivers may have different circuitry and/or functionality. In operation, one or more segment of a sliver is deactivated. For example, if one segment in a sliver is faulty, that segment is deactivated, while other segments in the sliver are activated and operable. Further, for example, if no segment in a sliver is faulty, any segment in that sliver can be chosen to be deactivated, while other segments in the sliver are activated and operable.

In the context of the illustrated example, three slivers are in the die stack 400. A first sliver includes segments 412-1, 414-1, 416-1. A second sliver includes segments 412-2, 414-2, 416-2. A third sliver includes segments 412-3, 414-3, 416-3. In this example, as long as one or no segment in each sliver is faulty, the die stack 400 can be operated as logically including two dies. For example, if segments 414-1, 416-2, 412-3 are faulty and/or deactivated, segments 412-1, 416-1 can be operated in the first sliver; segments 412-2, 414-2 can be operated in the second sliver; and segments 414-3, 416-3 can be operated in the third sliver.

Each segment within a sliver can communicate with other segments within that sliver via connections 420. The connections 420 can be passive connections that include, e.g., TSVs and metal lines and vias in metal layers. Hence, deactivating an intervening segment in a sliver may not affect other segments within that sliver from communicating with each other via the connections 420. In some examples, the segments in a sliver may include separate receive and drive circuitry for relaying signals via connections 420 which is unaffected when a given segment in the sliver is deactivated. For example, if the segment 414-1 is deactivated, the driver and receiver circuitry for the connections 420 through the segment 414-1 may still be operational so that the segments 412-1, 416-1 can communicate via the connections 420. Accordingly, in some examples, not all of the circuitry in a deactivated segment may be unused.

Inter-chip bridges 422 are disposed at boundaries between segments that enable a respective segment to selectively communicate with a segment in a neighboring sliver. Via inter-chip bridges 422, each segment can communicate with another segment that is in a sliver neighboring the respective segment and that is in the same die as the respective segment or in a die neighboring the die in which the respective segment is disposed. For example, via inter-chip bridges 422, segment 414-2 in the second sliver is capable of communicating with one or more of segments 412-1, 414-1, 416-1 in the first sliver, and via other inter-chip bridges 422, segment 414-2 in the second sliver is capable of communicating with one or more of segments 412-3, 414-3, 416-3 in the third sliver. In some examples, where multiple redundant physical dies are included in a die stack, the inter-chip bridges may permit selective communication between segments that are on dies with one or more other dies intervening between the segments.

As an example, assume segments 414-1, 416-2, 412-3 are faulty and/or deactivated. Segments 412-1, 412-2, 414-3 can communicate via respective inter-chip bridges 422 and can be operated as a first logical die. Segments 416-1, 414-2, 416-3 can communicate via respective inter-chip bridges 422 and can be operated as a second logical die. Under such circumstances, the dies 402-406 of the die stack 400 operate as a logical two-die die stack. These features can be extended to die stacks with different number of physical dies and logical dies. For example, in preceding examples where four physical dies having a same IC are included in a die stack for redundancy, three logical dies can be implemented.

The inter-chip bridges 422 include active devices (e.g., including transistors) on a semiconductor substrate of a die, TSVs in the die, and metal layers in the die. A person having ordinary skill in the art will readily understand such components that can be implemented in an inter-chip bridge 422.

Figure 5:
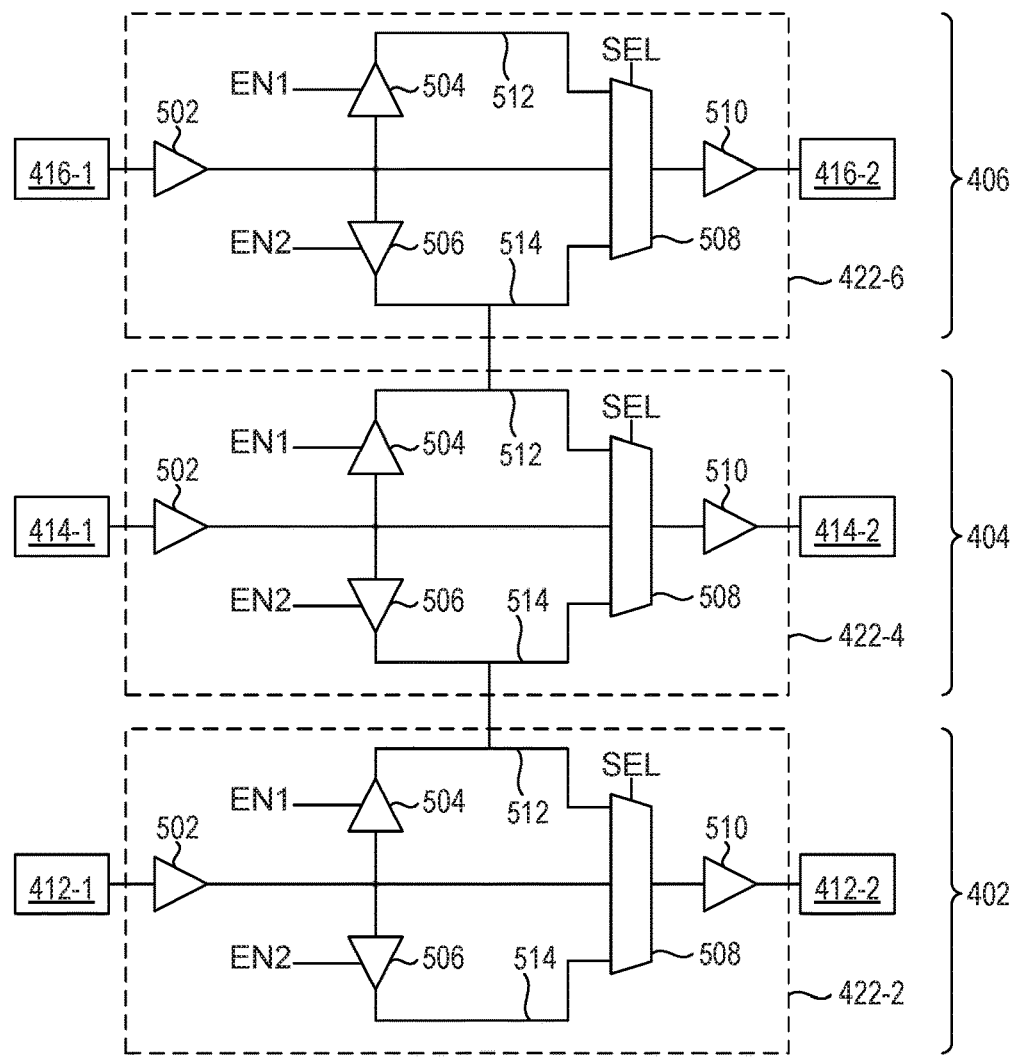
FIG. 5 illustrates a circuit schematic of inter-chip bridges on dies and between slivers according to some examples.

FIG. 5 illustrates a circuit schematic of inter-chip bridges 422-2, 422-4, 422-6 on dies 402, 404, 406, respectively, and between the first sliver and second sliver according to some examples. The inter-chip bridges 422 illustrated in FIG. 5 are shown as unidirectional (e.g., from the first sliver to the second sliver). A similar circuit schematic can additionally be implemented to permit bi-directional communication between the slivers (e.g., adding another unidirectional circuit from the second sliver to the first sliver). A person having ordinary skill in the art will readily understand such additions and that any number of circuits can be implemented as an inter-chip bridge 422 to enable communications.

Each of the inter-chip bridges 422-2, 422-4, 422-6 (individually or collectively, inter-chip bridge(s) 422) include a driver 502, tri-state drivers 504, 506, a multiplexer 508, and a driver 510. An input node of the driver 502 is connected to an output node of a respective segment 412-1, 414-1, 416-1 in the first sliver and on the same die 402-406 as the inter-chip bridge 422. An output node of the driver 502 is connected to respective input nodes of the tri-state drivers 504, 506 and multiplexer 508. Respective output nodes of the tri-state drivers 504, 506 are connected to a first node 512 and a second node 514, which are further connected to respective input nodes of the multiplexer 508. An output node of the multiplexer 508 is connected to an input node of the driver 510, and an output node of the driver 510 is connected to an input node of a respective segment 412-2, 414-2, 416-2 in the second sliver and on the same die 402-406 as the inter-chip bridge 422. Additionally, the first node 512 in an inter-chip bridge 422 of a die is connected to the second node 514 in an inter-chip bridge 422 of an overlying, neighboring die, e.g., via TSVs of one or both dies. For example, the first node 512 in the first die 402 is connected to the second node 514 in the second die 404, and the first node 512 in the second die 404 is connected to the second node 514 in the third die 406.

The tri-state drivers 504, 506 are controlled by respective enable signals EN1, EN2. For example, when the enable signals EN1, EN2 are asserted, the signal on the output node of the respective tri-state driver 504, 506 follows or corresponds to the signal in the input node of the tri-state driver 504, 506, and when the enable signals are not asserted, the impedance at the output node of the respective tri-state driver 504, 506 is in a high impedance output state. The multiplexer 508 is controlled by a select signal SEL to responsively output a signal that is input to the multiplexer 508 on one of the input nodes of the multiplexer 508.

Different examples illustrating communication to the segment 414-2 are described to illustrate different configurations of inter-chip bridges 422. A person having ordinary skill in the art will readily understand how these configurations can be applied for other inter-chip bridges 422 and/or for communication between other segments.

In a first example, segment 412-1 communicates with segment 414-2. In such an example, the segment 412-2 may be deactivated. The segment 412-1 outputs a signal (e.g., data) to the driver 502 in inter-chip bridge 422-2, and the driver 502 outputs the signal to the tri-state drivers 504, 506 and multiplexer 508 of the inter-chip bridge 422-2. The enable signal EN1 in the inter-chip bridge 422-2 causes the tri-state driver 504 in the inter-chip bridge 422-2 to output the signal on the first node 512 of the inter-chip bridge 422-2, and thus, to the second node 514 of the inter-chip bridge 422-4. The enable signal EN2 in the inter-chip bridge 422-2 causes the tri-state driver 506 in the inter-chip bridge 422-2 to be in a high impedance output state. The select signal SEL in the inter-chip bridge 422-2 causes the multiplexer 508 in the inter-chip bridge 422-2 to output a signal on the second node 514 in the inter-chip bridge 422-2. With the tri-state driver 506 in the inter-chip bridge 422-2 having a high impedance output state, no signal or a signal from an underlying die can be on the second node 514 in the inter-chip bridge 422-2, which can be propagated to segment 412-2.

The enable signal EN2 in the inter-chip bridge 422-4 causes the tri-state driver 506 in the inter-chip bridge 422-4 to be in a high impedance output state. The select signal SEL in the inter-chip bridge 422-4 causes the multiplexer 508 in the inter-chip bridge 422-4 to output a signal on the second node 514 in the inter-chip bridge 422-4, which is the signal output by the segment 412-1 via driver 502 and tri-state driver 504 in inter-chip bridge 422-2. Hence, the signal output by the segment 412-1 can be propagated to the segment 414-2.

In a second example, segment 414-1 communicates with segment 414-2. The segment 414-1 outputs a signal (e.g., data) to the driver 502 in inter-chip bridge 422-4, and the driver 502 outputs the signal to the tri-state drivers 504, 506 and multiplexer 508 of the inter-chip bridge 422-4. The select signal SEL in the inter-chip bridge 422-4 causes the multiplexer 508 in the inter-chip bridge 422-4 to output the signal from the driver 502 in the inter-chip bridge 422-4. Hence, the signal output by the segment 414-1 can be propagated to the segment 414-2. The enable signals EN1, EN2 in the inter-chip bridge 422-4 can cause the tri-state drivers 504, 506 in the inter-chip bridge 422-4 to be in a high impedance output state. The enable signal EN1 in the inter-chip bridge 422-2 can cause the tri-state driver 504 in the inter-chip bridge 422-2 to be in a high impedance output state. The enable signal EN2 in the inter-chip bridge 422-6 can cause the tri-state driver 506 in the inter-chip bridge 422-6 to be in a high impedance output state.

In a third example, segment 416-1 communicates with segment 414-2. In such an example, the segment 416-2 may be deactivated. The segment 416-1 outputs a signal (e.g., data) to the driver 502 in inter-chip bridge 422-6, and the driver 502 outputs the signal to the tri-state drivers 504, 506 and multiplexer 508 of the inter-chip bridge 422-6. The enable signal EN1 in the inter-chip bridge 422-6 causes the tri-state driver 504 in the inter-chip bridge 422-6 to be in a high impedance output state. The enable signal EN2 in the inter-chip bridge 422-6 causes the tri-state driver 506 in the inter-chip bridge 422-6 to output the signal on the second node 514 of the inter-chip bridge 422-6, and thus, to the first node 512 of the inter-chip bridge 422-4. The select signal SEL in the inter-chip bridge 422-6 causes the multiplexer 508 in the inter-chip bridge 422-6 to output a signal on the first node 512 in the inter-chip bridge 422-6. With the tri-state driver 504 in the inter-chip bridge 422-6 having a high impedance output, no signal or a signal from an overlying die can be on the first node 512 in the inter-chip bridge 422-6, which can be propagated to segment 416-2.

The enable signal EN1 in the inter-chip bridge 422-4 causes the tri-state driver 504 in the inter-chip bridge 422-4 to be in a high impedance output state. The select signal SEL in the inter-chip bridge 422-4 causes the multiplexer 508 in the inter-chip bridge 422-4 to output a signal on the first node 512 in the inter-chip bridge 422-4, which is the signal output by the segment 416-1 via driver 502 and tri-state driver 506 in inter-chip bridge 422-6. Hence, the signal output by the segment 416-1 can be propagated to the segment 414-2.

Data for the enable signals EN1, EN2 and the select signals SEL can be stored in, e.g., one or more configuration registers, eFuses, and/or other storage on the respective die 402-406. The data stored for these signals configures the inter-chip bridges 422 of the respective die 402-406. The data can be stored after the die stack 400 is manufactured and tested. Testing can indicate any segments that are faulty. If sufficient operable segments remain in each sliver based on the testing results, data can be stored in, e.g., the configuration registers, eFuses, and/or other storage to configure the inter-chip bridges 422 as appropriate to permit communications between operable segments. For example, eFuses can be blown to write data to the eFuses.

If more functional segments are available in any sliver than will be activated in a die stack, which segments to activate in such sliver can be based on considerations of junction temperature or power density, static power, performance, or some combination thereof. For example, referring to FIG. 4, if the segments 412-1, 414-1, 416-1 in the first sliver are functional and not faulty, and a logical two-die die stack is to be implemented, any two of the segments 412-1, 414-1, 416-1 can be activated, and any one of the segments 412-1, 414-1, 416-1 can be deactivated. Determining which one of the segments 412-1, 414-1, 416-1 to deactivate can be based on considerations of junction temperature or power density, static power, performance, or some combination thereof.

Figure 6:
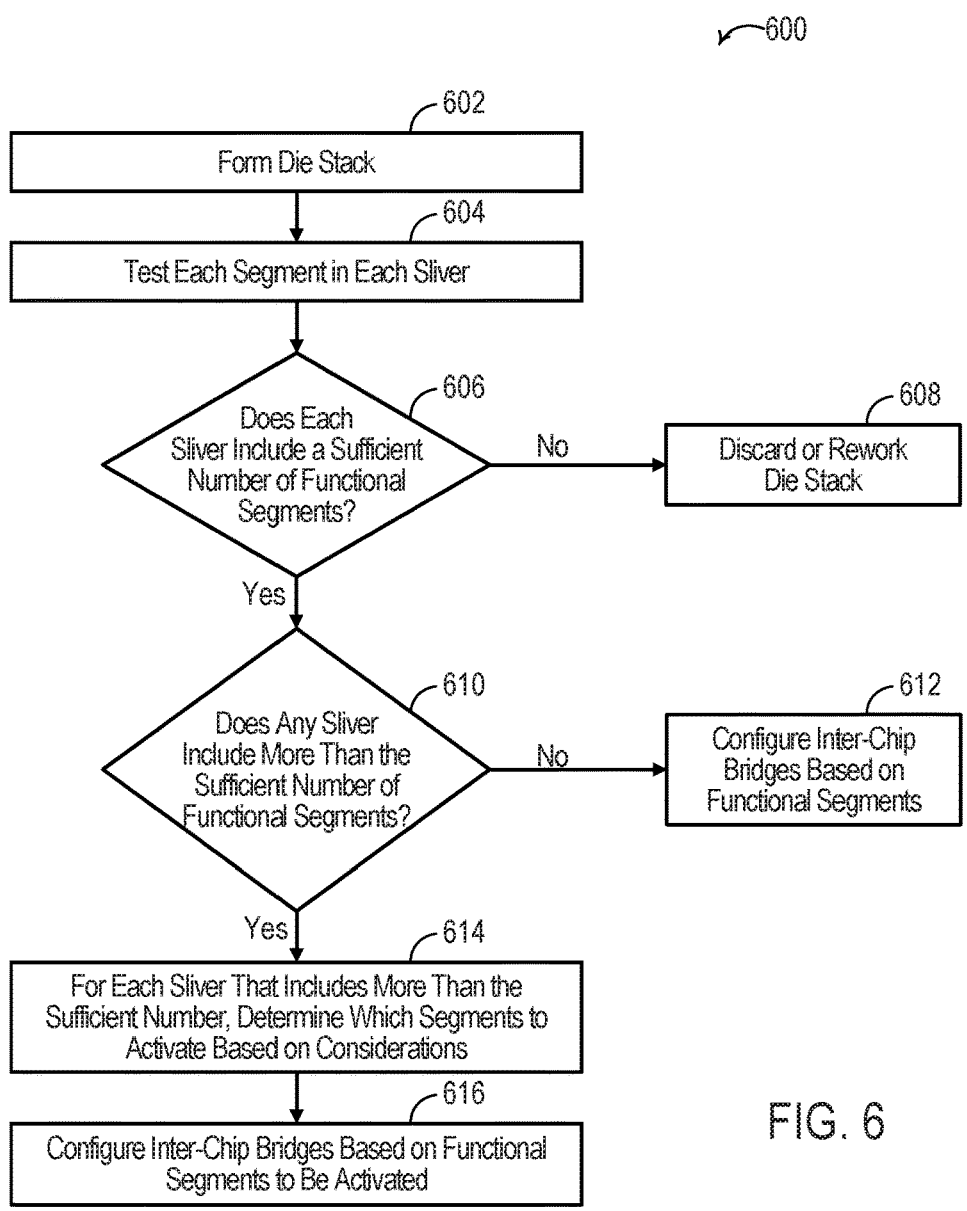
FIG. 6 is a flow chart of a method for forming and configuring a die stack for a multi-chip device according to some examples.

FIG. 6 is a flow chart of a method 600 for forming and configuring a die stack for a multi-chip device according to some examples. The method 600 of FIG. 6 can be implemented when redundant dies are included in a die stack. The method 600 can, in some situations, permit configuring dies to be activated dies and/or activated segments in dies based on considerations of junction temperature or power density, static power, performance, or some combination thereof. The method 600 may reference the multi-chip device of FIG. 1 and concepts described with respect to FIGS. 4 and 5.

At block 602, a die stack is formed. The die stack can be formed as described in method 300 of FIG. 3. In other examples, the die stack can generally be formed as described in method 300 of FIG. 3, except that the dies may not necessarily be stacked based on the characteristics. Characteristics of the dies, including characteristics of segments of the dies, can be determined during the formation of the die stack (e.g., by testing as described with reference to FIG. 3).

At block 604, each segment in each sliver in the dies implementing the redundancy is tested for functionality. N number of dies implement the redundancy in some examples. As an example of illustration purposes, assume that the four dies 104-110 (e.g., N=4) include segments of, e.g., programmable logic regions (e.g., fabric in an FPGA) that are logically and/or physically aligned in respective slivers, and that the multi-chip device is to be activated as logically implementing three dies having the programmable logic regions. Under such assumptions, one additional die is included for redundancy. Each of the segments in the dies 104-110 is tested to determine functionality of the segments.

At block 606, a determination is made whether each sliver includes a sufficient number of functional segments to implement a target number of logical dies. M number (where M≤N−1) can be the target number of logical dies in some examples, and block 606 can determine whether each sliver includes M number of functional segments. Referring to the example, block 606 determines whether each sliver includes at least three functional segments to implement three logical dies (e.g., M=3). If an insufficient number of functional segments are in any sliver (e.g., any sliver does not include M number of functional segments), at block 608, the die stack is discarded or reworked. Referring to the example, if any sliver includes two or fewer functional segments, the device stack is discarded or reworked.

In some examples, the target number of logical dies (that determines the sufficient number of functional segments in block 606) can be determined based on the number of functional segments in each sliver. For example, a manufacturer may provide a number of different product lines that include different number of logical dies. The manufacturer may attempt to produce a multi-chip device with the greatest number of logical dies, and when defects or faults prevent a multi-chip device from being able to be activated with that greatest number, the manufacturer may activate the multi-chip device to have as many logical dies as possible based on the functional segments and product lines. Referring to the example, if the manufacturer has product lines with three, two, and one logical die, and if a sliver has two functional and two non-functional segments while the remaining slivers have three or more functional segments, the die stack can be included in a multi-chip device having two logical dies rather than being discarded or reworked. In such a scenario the sufficient number of functional segments can change from three to two.

If a sufficient number of functional segments are in each sliver (e.g., each sliver includes at least M number of functional segments) as determined at block 606, at block 610, a determination is made whether any sliver includes more than the sufficient number of functional segments to implement the target number of logical dies. Block 610 can determine whether each sliver includes more than M number of functional segments. Referring to the example, block 610 determines whether any sliver has four functional segments. If no sliver includes more than the sufficient number of functional segments (e.g., no sliver includes more than M number of functional segments) as determined by block 610, at block 612, the inter-chip bridges of the dies in the die stack are configured based on the functional segments. When block 612 is reached, the minimum number of functional segments is included in each sliver in the dies, and each functional segment is activated to implement the multi-chip device having the target number (e.g., M number) of logical dies. Referring to the example, at block 612, each sliver in the dies 104-110 has three functional segments, and each of those functional segments is activated to form a multi-chip device having three logical dies.

If any sliver is determined at block 614 to include more than the sufficient number of functional segments to implement the target number of logical dies (e.g., one or more slivers each include more than M number of functional segments), for each sliver that has more than the sufficient number of functional segments, the segments that are to be activated (e.g., M number of segments for each sliver) are determined based on various possible considerations. The considerations can include junction temperature or power density, static power, performance, or some combination thereof.

In some examples, segments are determined to be activated based on considerations of junction temperature or power density. For example, consistent with the above description, having segments of slivers and/or dies closer to the heat sink be activated and segments of slivers and/or dies farther from the heat sink be deactivated can reduce junction temperatures between dies. Hence, segments that are closer to the heat sink can be activated to reduce junction temperature.

In some examples, segments are determined to be activated based on considerations of static power. For example, each segment could be powered up, and the power consumption of the powered-up segment can be determined. The segments that provide the least static power consumption can be determined to be activated, while other segments are deactivated. In some instances, this can recover from power and/or ground shorts or soft defects where a segment and/or die is functional but above a leakage current specification.

In some examples, segments are determined to be activated based on considerations of performance. For example, segments that are capable of operating the fastest can be activated, while some slower segments can be deactivated. Faster operating segments can have higher leakage current and can result in increased temperatures at the die. Hence, in some examples, dies are stacked as described with respect to FIG. 3, and the dies and segments that are capable of operating the fastest are closer to the heat sink. When considering performance, margins for signals can increase by activating faster segments, which can reduce the likelihood of failure on a critical path.

At block 616, the inter-chip bridges of the dies in the die stack are configured based on the functional segments to be activated. For any slivers that have the minimum number (e.g., M number) of functional segments to implement the target number of logical dies, each functional segment in such slivers is to be activated. For any slivers that have more than the minimum number (e.g., more than M number) of functional segments to implement the target number of logical dies, the functional segments to be activated are determined in block 614. The inter-chip bridges are configured such that the functional segments to be activated are able to be activated and are able to communicate appropriately. Further, the segments to be activated are activated, while remaining segments are deactivated, in block 616, e.g., by power gating and/or switching.

Various operations of blocks 604-616 can be performed using different mechanisms. For example, each of blocks 604-616 can be performed by a manufacturer in manufacturing a multi-chip device. As an example, the manufacturer can perform the test of block 604 when a package of the multi-chip device is formed, and a configuration system (e.g., a processor-based system like a computer executing software) operated by the manufacturer can perform the operations of blocks 606, 610-616, or some variation thereof, to configure the inter-chip bridges. For example, the configuration system can program eFuses on various ones of the dies to write configuration data for inter-chip bridges and for power gating.

In other examples, some operations can be performed by the multi-chip device, e.g., during a boot sequence and/or during execution of another program. The multi-chip device, such as a controller on a die that is not interchangeable, can perform a self-diagnostic test as block 604 that can determine if any segment is faulty and determine characteristics of each segment, such as static power consumption. The multi-chip device, such as the controller, can then perform blocks 610-616 to configure the multi-chip device.

While the foregoing is directed to specific examples, other and further examples may be devised without departing from the basic scope thereof, and the scope thereof is determined by the claims that follow.

What is claimed is:

1. A method of forming a multi-chip device, the method comprising:
   forming dies, at least two or more of the dies being interchangeable;
   determining characteristics of the at least two or more of the dies; and
   forming a die stack comprising the at least two or more of the dies, respective placements within the die stack of the at least two or more of the dies being based on the characteristics, wherein the characteristics include respective projected power densities in the die stack of the at least two or more of the dies, the at least two or more of the dies being placed within the die stack in an order of decreasing projected power densities from a placement of a heat dissipation element.

2. The method of claim 1, wherein the characteristics further include respective projected amounts of leakage current of the at least two or more of the dies, the at least two or more of the dies being placed within the die stack in an order of decreasing projected amounts of leakage current from the heat dissipation element.

3. The method of claim 1, wherein the at least two or more of the dies include a redundant die.

4. The method of claim 3, wherein the die stack includes N number of the at least two or more of the dies, the die stack being capable of implementing N−1 or fewer logical dies of the at least two or more of the dies.

5. The method of claim 4, wherein each of the at least two or more of the dies includes segments of integrated circuits, segments of the at least two or more of the dies aligning in respective slivers, any one or more segments in each of the respective slivers being capable of being deactivated to implement the N−1 or fewer logical dies.

6. The method of claim 1, wherein forming the die stack comprises wafer-to-wafer or die-to-wafer bonding the at least two or more of the dies.

7. The method of claim 1, wherein forming the die stack comprises attaching the at least two or more of the dies in the die stack using external electrical connectors.

8. A method of forming a multi-chip device, the method comprising: determining respective projected amounts of leakage current of interchangeable dies to be stacked in a die stack; and forming the die stack, placements in the die stack of the interchangeable dies being in an order of the interchangeable dies having increasing projected amounts of leakage current toward a heat sink attached to the die stack.

9. The method of claim 8, wherein the die stack includes N number of the interchangeable dies, the die stack being capable of implementing N−1 or fewer logical dies of the interchangeable dies.

10. The method of claim 9, wherein each of the interchangeable dies includes segments of integrated circuits, segments of the interchangeable dies aligning in respective slivers, any one or more segments in each of the slivers being capable of being deactivated to implement the N−1 or fewer logical dies.

11. The method of claim 8, wherein forming the die stack comprises wafer-to-wafer or die-to-wafer bonding the interchangeable dies.

12. The method of claim 8, wherein forming the die stack comprises attaching the interchangeable dies in the die stack using external electrical connectors.

13. A method of forming a multi-chip device, the method comprising:
    forming dies, at least two or more of the dies being interchangeable;
    determining characteristics of the at least two or more of the dies;
    forming a die stack comprising the at least two or more of the dies, respective placements within the die stack of the at least two or more of the dies being based on the characteristics;
    determining, after forming the die stack, whether segments of the at least two or more of the dies are functional, N number of the at least two or more of the dies being in the die stack, segments that align in the at least two or more of the dies forming respective slivers; and
    configuring the at least two or more of the dies into M number of logical dies when each sliver includes at least M number of the segments that are functional, the M number being less than the N number, wherein configuring the at least two or more of the dies into the M number of the logical dies further includes activating segments of each sliver that includes more than the M number of the segments that are functional based on a projected temperature of the die stack, a projected static power of the die stack, a projected performance of the die stack, or a combination thereof.

14. The method of claim 13, wherein activating the segments of each sliver that includes more than the M number of the segments that are functional is based on a projected junction temperature of the die stack.

15. The method of claim 13, wherein activating the segments of each sliver that includes more than the M number of the segments that are functional is based on the projected static power of the die stack, segments in a respective sliver that minimize static power consumption being activated.

16. The method of claim 13, wherein activating the segments of each sliver that includes more than the M number of the segments that are functional is based on the projected performance of the die stack, segments in a respective sliver that are capable of faster operation being activated.

17. The method of claim 13, wherein the characteristics include respective projected amounts of leakage current of the at least two or more of the dies, the at least two or more of the dies being placed within the die stack in an order of decreasing projected amounts of leakage current from a placement of a heat dissipation element.

18. The method of claim 13, wherein each of the at least two or more of the dies includes a programmable integrated circuit comprising respective segments, the respective segments of the programmable integrated circuit including respective segments of a programmable logic region.

\* \* \* \* \*